United States Patent
Mathieu

(10) Patent No.: US 9,509,299 B2
(45) Date of Patent: Nov. 29, 2016

(54) APPARATUS AND METHOD FOR CONTROL OF SEMICONDUCTOR SWITCHING DEVICES

(75) Inventor: Denis René Pierre Mathieu, Grenoble (FR)

(73) Assignee: SCHNEIDER ELECTRIC IT CORPORATION, West Kingston, RI (US)

(*) Notice: Subject to any disclaimer, the term of this patent is extended or adjusted under 35 U.S.C. 154(b) by 86 days.

(21) Appl. No.: 14/368,081

(22) PCT Filed: Jan. 5, 2012

(86) PCT No.: PCT/IB2012/000160
§ 371 (c)(1),
(2), (4) Date: Oct. 14, 2014

(87) PCT Pub. No.: WO2013/102778
PCT Pub. Date: Jul. 11, 2013

(65) Prior Publication Data
US 2015/0042397 A1  Feb. 12, 2015

(51) Int. Cl.
*H03L 5/00* (2006.01)
*H03K 5/08* (2006.01)
*H03K 17/082* (2006.01)
*H03K 17/16* (2006.01)
*H03K 17/567* (2006.01)

(52) U.S. Cl.
CPC ........ *H03K 17/0828* (2013.01); *H03K 17/166* (2013.01); *H03K 17/168* (2013.01); *H03K 17/567* (2013.01); *H03K 2217/0009* (2013.01)

(58) Field of Classification Search
USPC ................................................. 327/365–508
See application file for complete search history.

(56) References Cited

U.S. PATENT DOCUMENTS

| 5,920,224 | A | * | 7/1999 | Preslar | H03K 17/166 327/110 |
|---|---|---|---|---|---|
| 6,091,274 | A | | 7/2000 | Preslar | |
| 6,385,028 | B1 | * | 5/2002 | Kouno | H01L 27/0629 257/E27.016 |
| 6,906,574 | B2 | * | 6/2005 | Ohi | H03K 17/168 327/392 |
| 7,119,586 | B2 | * | 10/2006 | Hornkamp | H03K 17/166 327/108 |
| 2004/0075103 | A1 | * | 4/2004 | Topp | F02P 3/051 257/130 |

(Continued)

FOREIGN PATENT DOCUMENTS

EP  0997637 A1  5/2000

OTHER PUBLICATIONS

Dodge, et al. "IGBT tutorial: Part 1—Selection" EE Times. Mar. 8, 2007. http://www.eetimes.com/document.asp?doc_id=1273173.

(Continued)

*Primary Examiner* — Brandon S Cole
(74) *Attorney, Agent, or Firm* — Lando & Anastasi, LLP

(57) ABSTRACT

Disclosed is a control circuit for control of a semiconductor switching device, such as an IGBT. The control circuit comprising a first feedback path between a first electrode and a control electrode of said semiconductor switching device which has a capacitance. The circuit is operable such that the capacitance in the first feedback path is dependent on the voltage level at said first electrode. In another embodiment the control circuit is operable such that a feedback signal begins to flow in the first feedback path immediately as the semiconductor switching device begins switching off, thereby causing a control action on the semiconductor switching device.

18 Claims, 5 Drawing Sheets

(56) References Cited

U.S. PATENT DOCUMENTS

| | | | |
|---|---|---|---|
| 2005/0040434 A1* | 2/2005 | Hornkamp | H03K 17/166 257/202 |
| 2008/0106319 A1* | 5/2008 | Bayerer | H03K 17/0406 327/432 |
| 2010/0134179 A1* | 6/2010 | Bayerer | H03K 17/567 327/538 |
| 2011/0080192 A1* | 4/2011 | Ogawa | H03K 17/04123 327/109 |
| 2012/0051106 A1* | 3/2012 | Wagoner | H02M 1/08 363/123 |
| 2012/0139589 A1* | 6/2012 | Machida | H03K 17/0822 327/109 |
| 2012/0200320 A1* | 8/2012 | Thalheim | H03K 17/0828 327/109 |
| 2013/0154711 A1* | 6/2013 | Kuttenkuler | H03K 17/08128 327/326 |
| 2015/0155863 A1* | 6/2015 | Takasu | H03K 17/08142 327/108 |

OTHER PUBLICATIONS

Luniewski, Piotr, Uwe Jansen, and Michael Hornkamp. "Dynamic Voltage Rise Control, the Most Efficient Way to Control Turn-off Switching Behaviour of IGBT Transistors." PELINCEC2005, paper 80 (2005).

Jaunay, et al. "DC-to-DC Design Guide." Vishay Siliconix. http://www.vishay.com/docs/71917/71917.pdf. Oct. 2, 2010.

International Preliminary Report on Patentability dated Jul. 17, 2014 for PCT/IB2012/000160.

International Search Report dated Oct. 4, 2012 for PCT/IB2012/000160.

* cited by examiner

APPARATUS AND METHOD FOR CONTROL OF SEMICONDUCTOR SWITCHING DEVICES

The present disclosure relates to control of semiconductor switching devices, and in particular insulated-gate bipolar transistors (IGBT).

BACKGROUND

The state of the art in power converters provides an adjustable voltage and frequency to the output through a pulse width modulated (PWM, pulse width modulation) voltage source inverter drive. Power converters can be used in uninterruptible power supplies (UPS), electric motors, etc. The PWM command is used in the power converter for controlling power to inertial electrical devices, made practical by modern electronic power switches. The duty cycle of a switch (ratio of on-time to total cycle time) is varied to achieve a desired average output voltage, current etc., when averaged over time.

A typical power converter is a switching power converter. It has two or more power semiconductor devices such as power semiconductor switches. The power semiconductor switches can, for example, be implemented by insulated-gate bipolar transistors (IGBT). As the switching speed of such semiconductor switches increase and currents increase, it becomes increasingly difficult to limit turn-off voltages to a permissible range. Should the permissible voltage across the controlled path of a semiconductor switch be exceeded, it will be destroyed. A particularly critical case is that of a short circuit, where the rate of current change di/dt induces in the stray inductances a voltage which is added to the voltage present in any case. The resultant overvoltage can exceed the permissible voltages, particularly across the controlled path of the semiconductor switch.

One approach to addressing the overvoltage is to increase the size of the resistor at the gate of the semiconductor switch. However, in order for this to be effective, the size of the resistor becomes too great and switching losses become unacceptable. Another method is to feedback the collector-emitter voltage to the gate of the semiconductor switch in order to maintain it in the on-state for a time determined by stray inductances in the high power circuit. The rise in the gate voltage limits the rise in the collector-emitter voltage. However, this method is largely ineffective due to the significant delay between the gate voltage falling below the Miller plateau and the rise of the collector-emitter voltage.

Another approach is to provide an active clamp, such as described in U.S. Pat. No. 7,119,586. Here, the active clamp is incorporated in the circuit between the semiconductor switch's collector and the input to the gate driver stage. This active clamp determines the voltage across the emitter-collector path of the semiconductor switch, and in this manner detects the beginning of the cut-off state, thereby freezing the instantaneous value of the switching signal. Since the semiconductor switch remains longer at the voltage level of the Miller Plateau, a small rate of current change di/dt of the collector current is achieved when turning-off particularly high voltages. This method of active clamping tends to result in a change in collector current slope without significantly increasing switching losses.

It is an aim of the present invention to address one or more of these issues with the prior art.

In a first aspect of the invention there is provided a control circuit for control of a semiconductor switching device comprising a first feedback path between a first electrode and a control electrode of said semiconductor switching device, said first feedback path comprising a capacitance, said control circuit being operable such that the capacitance in the first feedback path is dependent on the voltage level at said first electrode.

In a second aspect of the invention there is provided a control circuit for control of a semiconductor switching device comprising a first feedback path between a first electrode and a control electrode of said semiconductor switching device and comprising a capacitance, said control circuit being operable such that a feedback signal begins to flow in the first feedback path immediately as the semiconductor switching device begins switching off, thereby causing a control action on said semiconductor switching device.

Other optional aspects are as disclosed in the appended dependent claims.

BRIEF DESCRIPTION OF THE DRAWINGS

Embodiments of the invention will now be described, by way of example only, by reference to the accompanying drawings, in which.

DETAILED DESCRIPTION OF THE EMBODIMENTS

Figure 1:
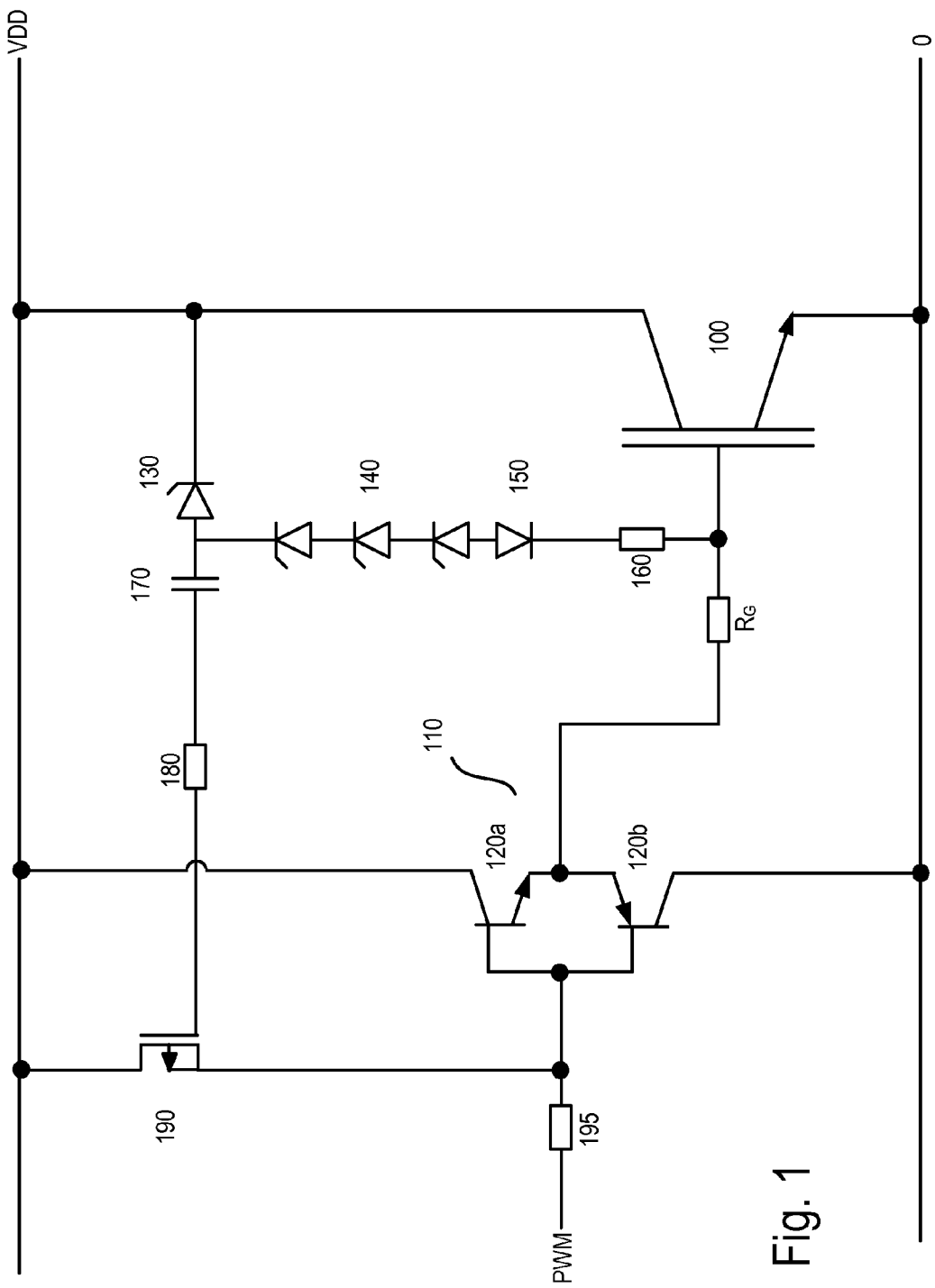
FIG. 1 shows an active driver circuit according to the prior art, driving an IGBT.

FIG. 1 shows a prior art active driver circuit driving an Insulated Gate Bipolar Transistor (IGBT) 100. The driving circuit receives a switching signal such as a pulse width modulated signal PWM, and drives the IGBT 100 in dependence on the switching signal PWM. The driving circuit consists of at least one driver stage 110, which consists, in this example, of a push-pull emitter follower comprising two bipolar transistors 120a and 120b. One or more further driving stages may precede driving stage 110. The output of the driver stage 110 is connected to the gate of IGBT 100 via gate resistor $R_G$. A first feedback path between collector and the input of driver stage 110 is provided. This first feedback path comprises transient-voltage-suppression (TVS) diode 130, capacitor 170, resistor 180 and switch 190. Also provided is a second feedback path between collector and gate of the IGBT. This path comprises TVS diode 130, further TVS diodes in series 140, diode 150 and resistor 160.

This circuit operates as follows. The PWM signal is received via the driver stage 110 at the IGBT's 100 gate. As the gate voltage changes polarity, the IGBT 100 is cut off and the voltage between emitter and collector of the IGBT 100 rises. Once the threshold set by TVS diode 130 is reached the potential at the capacitor 170 changes and a current flows through the first feedback path via the resistor 180. The voltage dropped across the resistor 180 switches on the switch 190, causing a current to flow through the switch 190. Due to this current, in turn, a positive voltage is dropped across the resistance 195 which holds the IGBT 100 at its Miller Plateau directly via the driver stage 110. Consequently, the IGBT 100 remains in its active region.

This significantly reduces the current slope, and hence the instantaneous rate of change in voltage dv/dt across the IGBT is limited.

The second, optional, feedback path provides a further clamping action on the IGBT's gate by directly applying the collector-emitter current to the gate, via resistance 160 and TVS diodes 130, 140. The TVS diodes 130,140 in series result in a higher threshold being required before this further clamping action takes effect, compared to the threshold required for the clamping action of the first feedback circuit to take effect. This only happens when in an overvoltage situation, under normal operation the collector-emitter voltage will not exceed this higher threshold.

Figure 2:
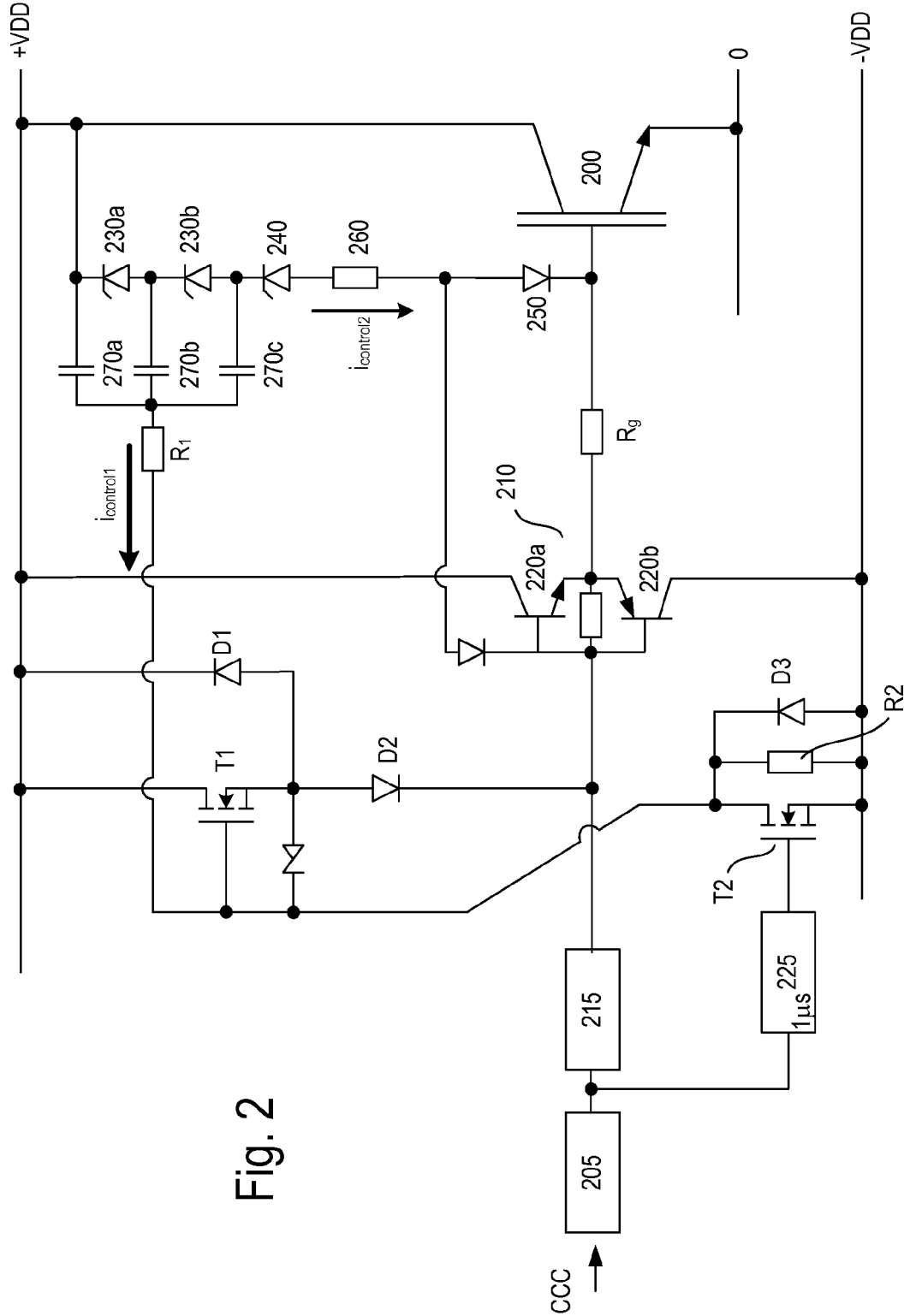
FIG. 2 shows an active driver circuit according to the present invention, driving an IGBT.

FIG. 2 shows a modified active driver circuit driving an IGBT 200. The circuit operates in a similar manner to that of FIG. 1. The main difference is in the first feedback path, where there is a plurality (in this example, three) capacitors 270a, 270b, 270c, in parallel. The first capacitor 270a has no TVS diode at its input, and therefore the rising collector-emitter voltage is immediately applied to it, resulting in a current flow in the first feedback path. However, as the collector-emitter voltage continues to increase, the threshold set by TVS diode 230a is met, followed by the threshold set by the combination of TVS diodes 230a and 230b. This results in, firstly, current being conducted through capacitor 270b in parallel with 270a and then through all three capacitors 270a, 270b, 270c. The instantaneous current $i_{control1}$ through this feedback path is given by:

$$i_{control1} = C \cdot dv_{ce}/dt$$

where C is the capacitance in the feedback loop and $dv_{ce}/dt$ is the instantaneous rate of change of the IGBT's 200 collector-emitter voltage. Consequently, as each threshold is passed, the effective capacitance in the feedback loop increases, and with it the current in the feedback loop.

The way that the feedback current $i_{control1}$ is used to control the driver stage 210 also differs from the circuit of FIG. 1. FIG. 2 shows a core control command CCC (which causes the PWM signal) input via isolation 205 and amplification 215 to the driver stage 210. This core control command also provides an inhibition command 225 at the base of switch T2. In parallel with switch T2 is resistor R2 and diode D3. The first feedback path is connected to the gate of switch T1, which connects the positive rail to the driver stage 210 input via diode D2.

Feedback current $i_{control1}$ passes through resistor R1 with a consequent current being injected into resistor R2. The voltage across resistor R2 rises, and switch T1 is turned on. Switch T1 acts as a current amplifier in order to control transistor 220a such that the power IGBT 200 stays in its active region as described in relation to FIG. 1.

This action is inhibited as a result of the inhibition command 225 after a delay of (in this example) 1 μs. After that time, switch T2 is turned on and no more action from resistor R2 can occur. The capacitors 270a 270b 270c are discharged through diode D3 and resistor R1 when the power IGBT 200 is turned on, and are therefore ready to control the next turn off of the power IGBT 200.

The second feedback path operates in the same was as that of FIG. 1.

A main difference with the circuit of FIG. 1 is that the feedback current $i_{control1}$ begins to flow in the first feedback path, and therefore the control action occurs, immediately on the IGBT being switched off. In addition, the control signal in the first feedback loop increases with the collector emitter current. In this way, the multilevel thresholds lead to a better overvoltage control, without a significant amount of extra losses.

Figure 3:
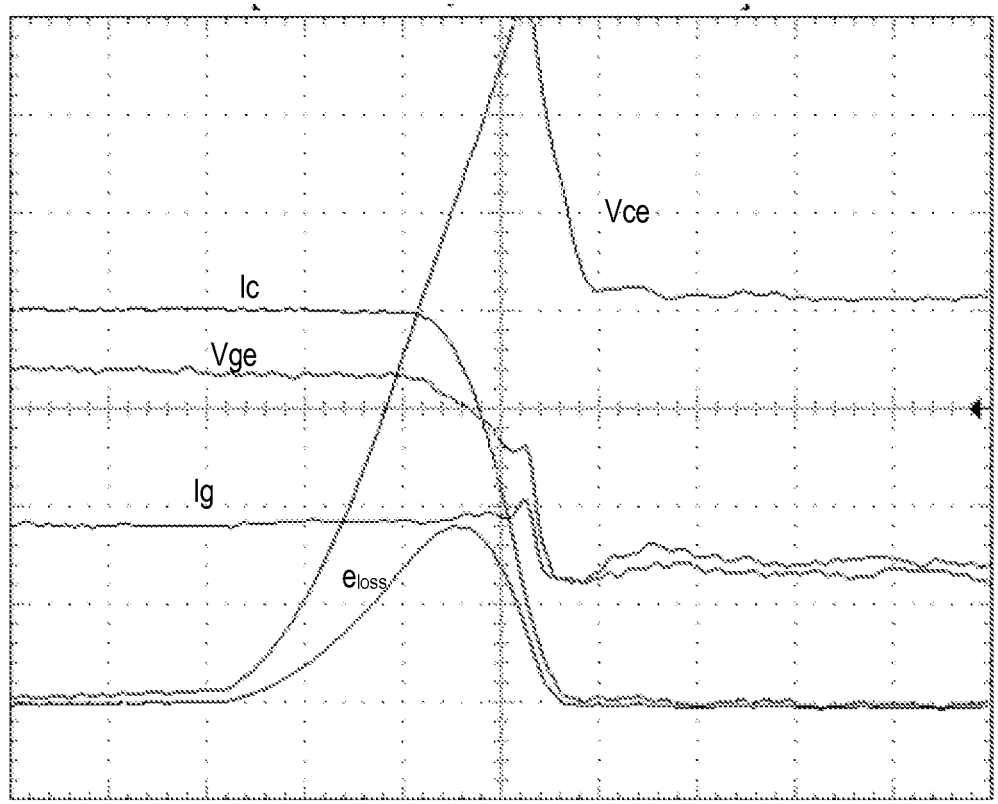
FIG. 3 shows traces of a number of signal levels over time for an IGBT without any active voltage control.
Figure 4:
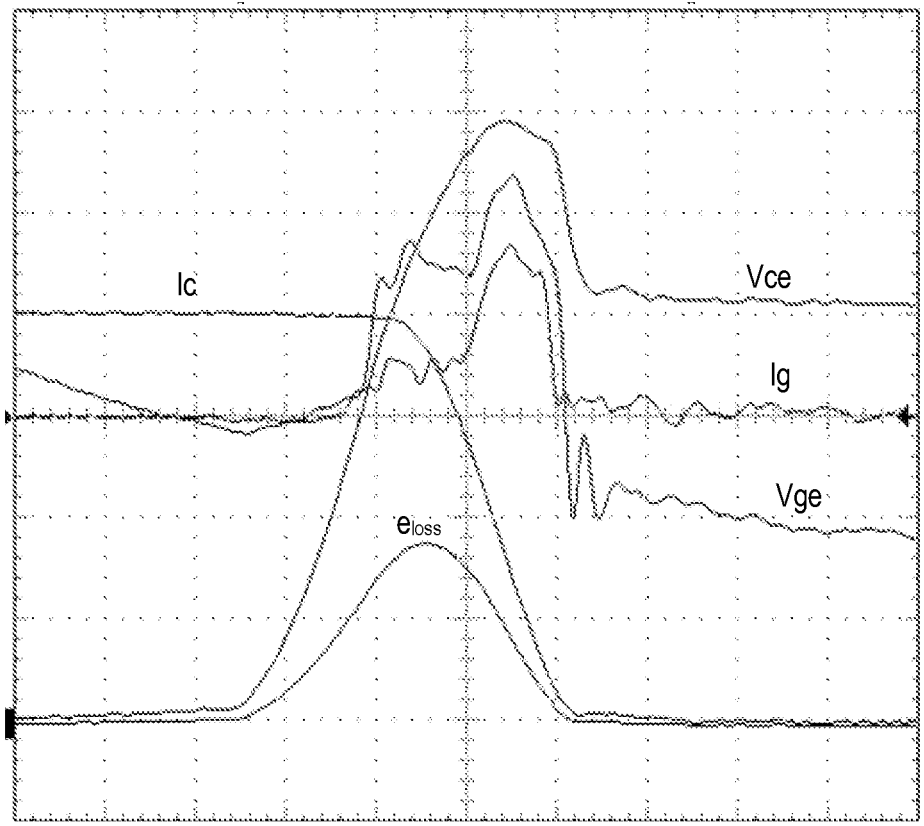
FIGS. 4 and 5 show traces of a number of signal levels over time for an IGBT driven using an active driver circuit according to an embodiment of the invention.

FIG. 3 shows traces for the collector current Ic, the gate voltage Vge, the collector-emitter overvoltage Vce, the energy losses $e_{loss}$ and the gate current Ig for a power IGBT without active voltage control, while FIG. 4 shows the same traces obtained for a power IGBT using the circuit of FIG. 2.

The IGBT is turning off 400 A in both of these Figures. In FIG. 4, the gate voltage Vge can be seen to have a number of peaks, each representing a threshold reached. This results in better control of the collector-emitter overvoltage Vce. In FIG. 3 the overvoltage can be seen to peak above 700V while in FIG. 4 it is constrained below 600V.

Figure 5:
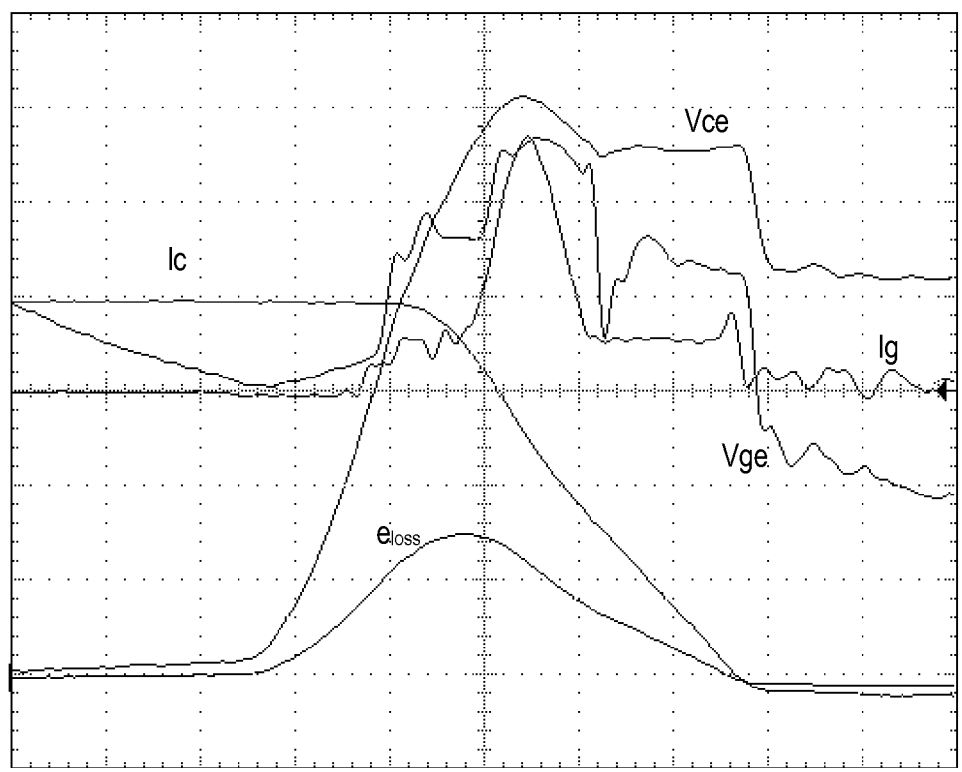

FIG. 5 shows the same traces as FIG. 4 using the circuit of FIG. 2, but this time turning off 800 A. The IGBT has a max current of 400 A (this is a one shot test, as the IGBT cannot withstand this current permanently). At this current, it can be seen that the peak overvoltage Vce is very close to (only very slightly higher) than that shown in FIG. 4, for which the IGBT switching off 400 A.

While this detailed description has set forth some embodiments of the present invention, the appended claims cover other embodiments of the present invention which differ from the described embodiments according to various modifications and improvements and/or which can be envisaged without departing from the spirit or scope of the invention.

The invention claimed is:

1. A control circuit for control of a semiconductor switching device comprising:
    a first feedback path between a first electrode and a control electrode of said semiconductor switching device, said first feedback path comprising a plurality of capacitors and a plurality of threshold devices, said control circuit being operable such that a capacitance in the first feedback path is dependent on the voltage level at said first electrode, said plurality of capacitors and said plurality of threshold devices arranged such that a first one of the plurality of capacitors will become operationally arranged in parallel with a second one of the plurality of capacitors upon the voltage level at the first electrode being greater than a threshold level.

2. A control circuit as claimed in claim 1 wherein no threshold device is provided between a first of said plurality of capacitors and said first electrode.

3. A control circuit as claimed in claim 1 wherein each of the plurality of capacitors has an input and an output, with the output of each of the plurality of capacitors coupled to a common point, and each of the plurality of threshold devices is connected between the inputs of two of the plurality of capacitors.

4. A control circuit as claimed in claim 1 being operable such that each threshold device causes a corresponding threshold voltage level to be set, said circuit being operable such that each time the voltage level at the first electrode exceeds a threshold voltage level, a further capacitor is switched into the feedback path and therefore contributes to said capacitance in the first feedback path.

5. A control circuit as claimed in claim 1 wherein at least one of the plurality of threshold devices comprises a transient-voltage-suppression diode.

6. A control circuit as claimed in claim 1 being operable such that when the level on the control electrode goes high, said semiconductor switching device begins to conduct and the voltage level on said first electrode rises, said first feedback path being operable to apply a feedback signal dependent on the voltage level on said first electrode to said control electrode thereby reducing urate at which the voltage level on said first electrode rises.

7. A control circuit as claimed in claim 6 being operable to stop applying the feedback signal to the control electrode and to discharge said plurality of capacitors after a predetermined time delay.

8. A control circuit as claimed in claim 1, wherein said semiconductor switching device is a transistor device, said first electrode is the collector/source electrode and said control electrode is the base/gate electrode.

9. A control circuit as claimed in claim 8 wherein said semiconductor switching device is an insulated gate bipolar transistor.

10. A control circuit as claimed in claim 1 wherein the control circuit comprises a driver stage, for driving said control electrode, a signal level on the driver stage input being dependent on the first feedback path.

11. A control circuit as claimed in claim 1 comprising a second feedback path, said second feedback path comprising a further threshold device and being operable to apply a signal directly to said control electrode when the voltage level at said first electrode exceeds a threshold level set by said further threshold device in said second feedback path.

12. A control circuit for control of a semiconductor switching device comprising:
a first feedback path between a first electrode and a control electrode of said semiconductor switching device and comprising a plurality of capacitors and a plurality of threshold devices, said control circuit being operable such that a feedback signal begins to flow in the first feedback path immediately as the semiconductor switching device begins switching off, thereby causing a control action on said semiconductor switching device, and said control circuit including a driver stage, for driving said control electrode, a signal level on the driver stage input being dependent on the first feedback path.

13. A control circuit as claimed in claim 12 being operable such that when the level on the control electrode goes high, said semiconductor switching device begins to conduct and the voltage level on said first electrode rises, said first feedback path being operable to apply the feedback signal on said first electrode to said control electrode thereby reducing the rate at which the voltage level on said first electrode rises.

14. A control circuit as claimed in claim 13 being operable to stop applying the feedback signal to the control electrode and to discharge said plurality of capacitors after a predetermined time delay.

15. A control circuit as claimed in claim 12 wherein said semiconductor switching device is a transistor device, said first electrode is the collector/source electrode and said control electrode is the base/gate electrode.

16. A control circuit as claimed in claim 15 wherein said semiconductor switching device is an insulated gate bipolar transistor.

17. A control circuit as claimed in claim 12 comprising a second feedback path, said second feedback path comprising a further threshold device and being operable to apply a signal directly to said control electrode when the voltage level at said first electrode exceeds a threshold level set by said further threshold device in said second feedback path.

18. A control circuit for control of a semiconductor switching device comprising:
a first feedback path between a first electrode and a control electrode of said semiconductor switching device, said first feedback path comprising a plurality of capacitors and a plurality of threshold devices, said control circuit being operable such that a capacitance in the first feedback path is dependent on the voltage level at said first electrode, said control circuit operable such that each threshold device causes a corresponding threshold voltage level to be set, and said control circuit being operable such that each time the voltage level at the first electrode exceeds a threshold voltage level, a further capacitor is switched into the feedback path and therefore contributes to said capacitance in the first feedback path.

* * * * *